United States Patent [19]

Engelbrecht et al.

[11] 4,362,384

[45] Dec. 7, 1982

[54] MEANS FOR PROVIDING UNIFORM ILLUMINATION TO A LIGHT SENSITIVE ELEMENT

[75] Inventors: Orest Engelbrecht, Bethel; David A. Markle, Norwalk, both of Conn.

[73] Assignee: The Perkin-Elmer Corporation, Norwalk, Conn.

[21] Appl. No.: 261,314

[22] Filed: May 1, 1981

[51] Int. Cl.³ ............................................. G03B 27/72
[52] U.S. Cl. .................................................... 355/71
[58] Field of Search ............................ 355/71; 354/241

[56] References Cited

U.S. PATENT DOCUMENTS

| | | | |
|---|---|---|---|
| 3,594,081 | 7/1971 | Tschink | 355/71 |
| 3,722,980 | 3/1973 | Craig | 355/71 |
| 3,907,427 | 9/1975 | Tschink et al. | 355/71 |
| 3,967,895 | 7/1976 | Crook | 355/71 |
| 4,068,947 | 1/1978 | Buckley et al. | 355/72 |
| 4,080,057 | 3/1978 | Nakane et al. | 355/71 |
| 4,125,323 | 11/1978 | Ikeda et al. | 355/71 |

Primary Examiner—Monroe H. Hayes
Attorney, Agent, or Firm—S. A. Giarratana; E. T. Grimes; T. P. Murphy

[57] ABSTRACT

In a ring field projection optical system for imaging a mask on a wafer the illumination source has readily adjustable means for obtaining uniform exposure along the length of the arcuate zone of illumination.

4 Claims, 4 Drawing Figures

MEANS FOR PROVIDING UNIFORM ILLUMINATION TO A LIGHT SENSITIVE ELEMENT

BACKGROUND OF THE INVENTION

In the manufacture of so-called integrated circuits, an image from a mask is generally transferred to a wafer having photoresist material thereon. The photoresist material on the wafer reacts to light projected thereon to cause an image to be reproduced.

In some cases, the mask is laid against the wafer to produce the image. However, in a patent "Optical Projection and Scanning Apparatus," U.S. Pat. No. 4,068,947, issued Jan. 17, 1978, there is disclosed a system wherein the mask is not in contact with the wafer to reproduce the image. In this patent light is projected through the mask into an imaging system and then onto the wafer to image the mask onto the wafer thereby, increasing the life of the mask since no friction is involved between the two elements. An optical system is disposed between the mask and the wafer.

In the aforementioned patent, flat, convex and concave mirrors provide distortion free unit magnification with accessible object and image planes in which the contrast is uniformly high and relatively constant.

In order to obtain best results, the illumination on the mask reproduced is a curved arc of illumination that conforms to a narrow zone of good correction concentric with the axis of the projection optical system. The illuminated area on the mask is determined by an illumination system (condenser) that contains a curved slit that is imaged on the mask plane of the projection system where the optical correction of the projection system is optimum.

Means for scanning and various optical elements of the system are described in the aforementioned patent. Further details of the theory relating to the optical system involved is disclosed in another patent entitled "Unit Power Imaging Catoptric Anastigmat," U.S. Pat. No. 3,748,015, issued July 24, 1973. Both of the above mentioned patents are assigned to the same assignee as the present invention.

While the above system operates very satisfactorily, it was found that in some cases the illumination or intensity of the light transmitted through the slit opening to the wafer sometimes tends to vary slightly along the length of the slit opening. In order to assure optimum image reproduction, it is desirable that the light along the entire length of the slit opening be uniform. The present invention is directed generally towards a system illustrated in FIG. 5 of U.S. Pat. No. 4,068,947, although clearly not limited to such systems. Particularly, it is directed towards slit element 512 in FIG. 5.

OBJECTS OF THE INVENTION

It is an object of this invention to provide means for providing relatively uniform exposure in a ring field projection system.

It is a further object of this invention to provide adjustable means for providing relatively uniform illumination along the entire length of a curved area.

It is still a further object of this invention to provide an improved means for providing uniform illumination along the entire length of a curved area in which the illumination at different areas of the curved area is selectively controlled.

BRIEF SUMMARY OF THE INVENTION

In accordance with the present invention, light is transmitted through a member having a slot opening to a mask for reproducing an image of the mask on a wafer. The slit opening composes a curved area arcuate in shape. Adjustable means are associated with the member to selectively vary the size of the slit opening at discrete areas along the length to control the amount of light passing to the wafer. This makes it possible to provide relatively uniform light intensity through the member along the entire length of the slit opening.

Other objects and advantages of the present invention will be apparent and suggest themselves to those skilled in the art, from a reading of the following specification and claims, in conjunction with the accompanying drawings.

DESCRIPTION OF THE PREFERRED EMBODIMENTS

Figure 1:
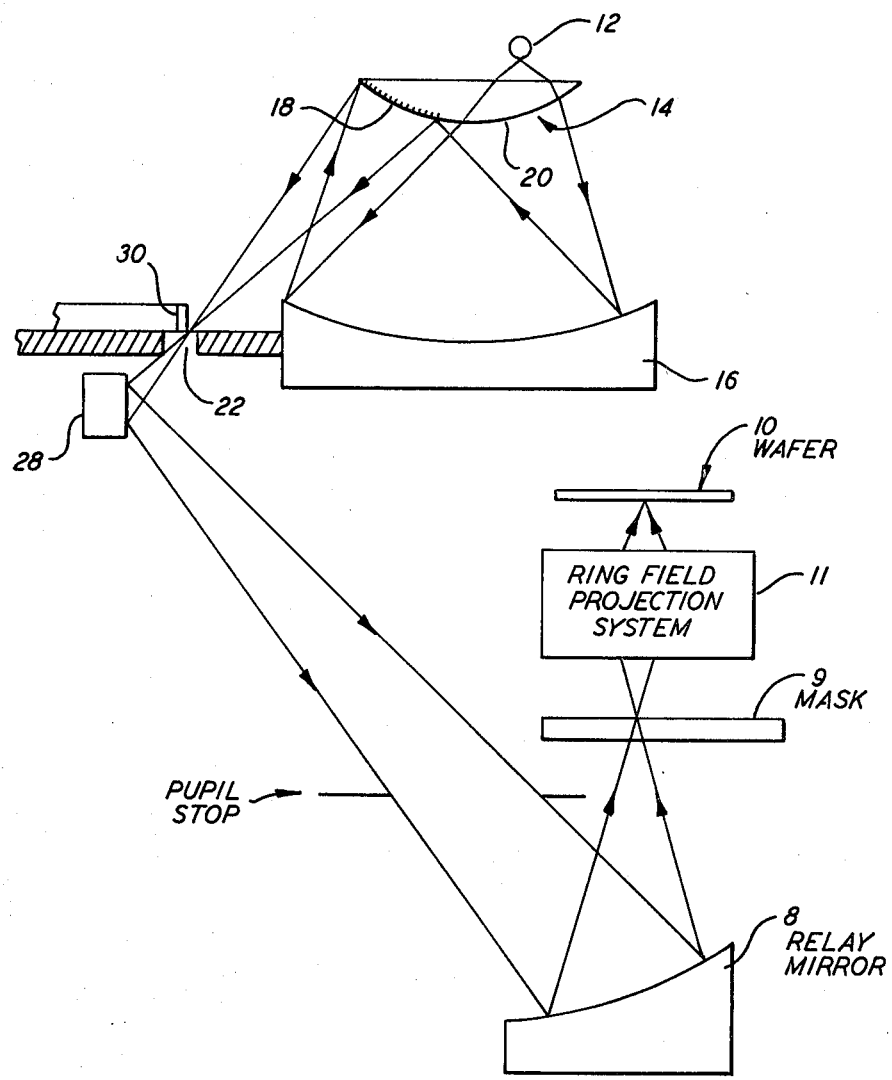
FIG. 1 is a schematic representation illustrating an illumination system in which the present invention may be employed.

Referring to FIG. 1 a ring field projection system 11 is disposed to image a mask 9 onto a wafer 10. The ring field projection system 11, described more fully in U.S. Pat. No. 3,748,015 which has the same assignee as the present invention, produces optimum imagery only in a narrow circular zone concentric with the axis of the system. The illumination system therefore must provide uniform illumination in this narrow circular zone. The narrow zone of illumination is arranged to stretch across the mask but covers only a small portion at any time. A scanning system which moves the mask and wafer in synchronism thru the illuminated zone of good imagery to permit the entire mask to be copied onto the wafer. The various components of such a system are described in U.S. Pat. No. 4,068,947.

Light is transmitted from a lamp 12 and is passed through lens 14 to a reflecting mirror 16 which may be concave in shape. The lens 14 is silvered at area 18 to reflect light and uncoated at area 20 to permit light to pass through. The directions of that light transmitted through the lens 14 are indicated by the lines with arrows. Light from the concave mirror 16 is reflected to the convex lens 14 on the silvered or mirrored area 18. The reflected light is directed through a slit opening 22 in a member 37 to a toroidal mirror 28.

From the toroidal mirror 28 the light passes thru a stop and it is again reflected by a relay mirror 8 before coming to the mask 9. The lens 14 and the two mirrors 16 and 18 serve to form an image of the curved lamp 12 on the slit opening 22. The slit opening 22 is reimaged on the mask 9 by the toroidal mirror 28 and the relay mirror 8.

Figure 2:
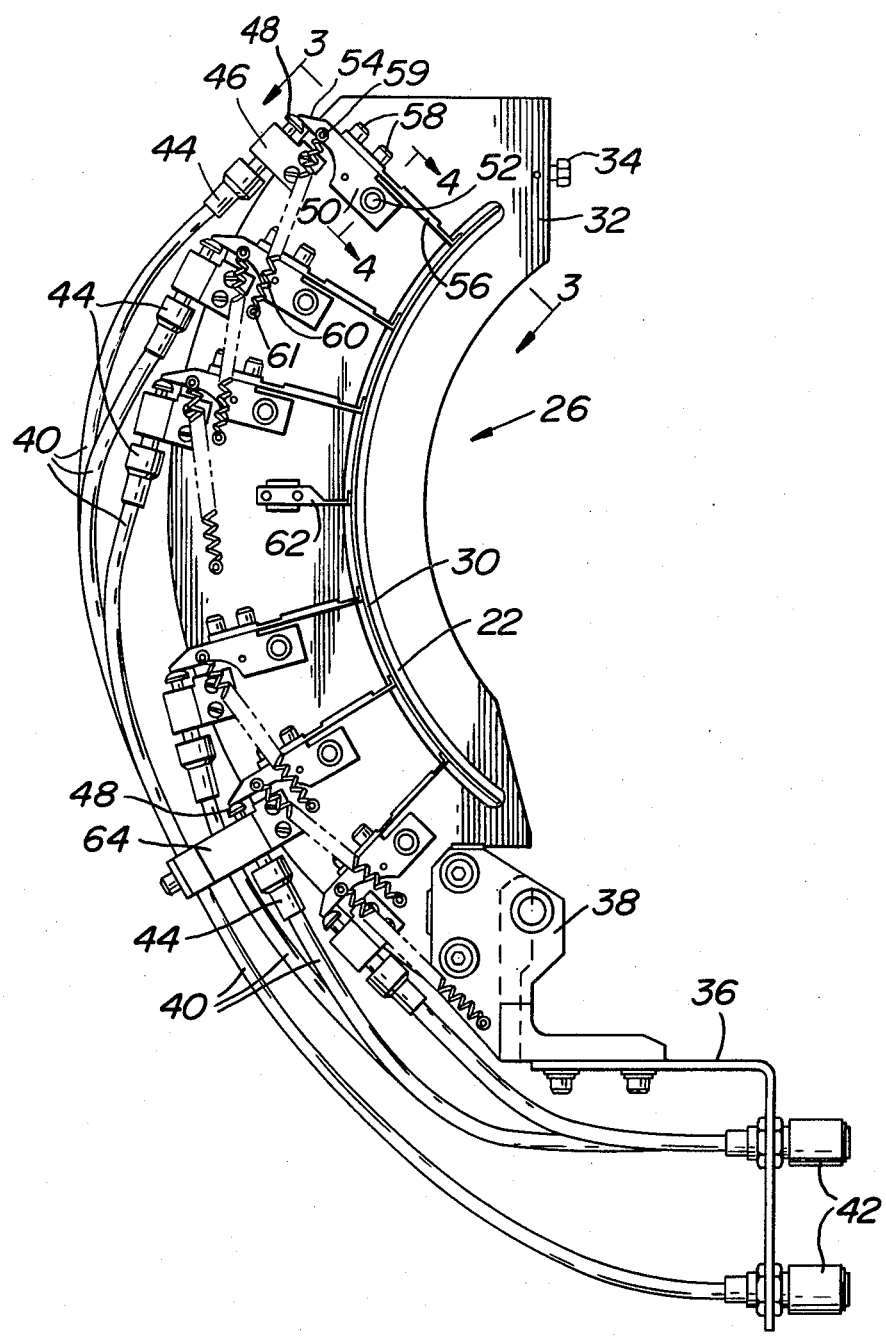
FIG. 2 is a plan view illustrating the details of a member having an adjustable slit opening for controlling the illumination of a wafer, in accordance with the present invention.

The member 26, which may comprise more than one part, includes an elongated curved slit opening 22 more clearly illustrated in FIG. 2 to be described.

The member 26 includes a perpendicularly disposed flexible band assembly 30 which obstructs light from the area 18 on one side of the slit opening 22. Adjustable means 31 illustrated in detail in FIG. 2, may be employed to move the band 30 in one direction or the other to vary the light passing through discrete areas along the entire length of the curved slit opening 22.

Figure 3:
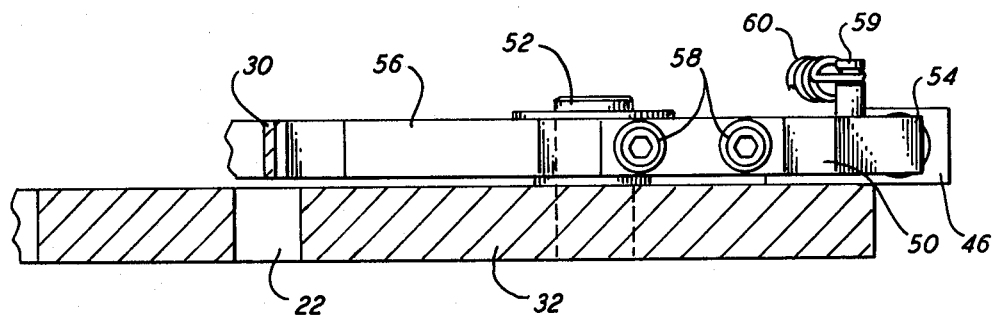
FIG. 3 is a cross-sectional view taken along line 3—3 of FIG. 2.
Figure 4:
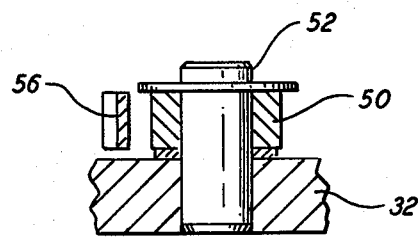
FIG. 4 is a cross-sectional view taken along line 4—4 of FIG. 2.

Referring to FIGS. 2, 3, and 4, the member 26 includes the flexible band 30 along the entire length of slit opening 22. As illustrated in FIG. 1, the flexible band 30 is disposed to obstruct light through the slit opening 22 on one side of the slit.

In FIG. 2, a plurality of similar types of adjustment means are employed to flex or control different areas of the band 30. In describing such similar adjustment means, only one set of elements in the adjustment means will be described in detail, it being understood that such description is also applicable to similar type elements illustrated.

The member or assembly 26 comprises a base plate 32 adapted to be suitably located within a system such as illustrated in FIG. 1. Precise alignment of the base plate 32 may be provided by a locating screw 34.

A cable bracket 36 is mounted to a plate pivot assembly 38. Six similar cables of different lengths 40 are connected from six adjustment knobs 42 mounted to the bracket 36 and connectors 44 which are connected to couplers 46 which lead to the adjustment elements. While six cables are illustrated, it is apparent that any number may be used dependent upon the system involved and the degrees of adjustments required.

The cables 40 may be flexible drive cables which are conventional. Manual adjustments of the knobs 42 transmits rotary motion of the cables 40 to connectors 44. Couplers 46 convert the cable rotation to helical motion on elements 48 which are threaded into the couplers. Pivot arms 50 are secured to the plate 32 through pivot pins 52. The pivot arms 50 include extensions 54 which engage movable elements 48. The pivot arms 50 include flexible bands 56 secured thereto by means of screws 58.

The pivot arms 50 are normally biased in a counter-clockwise direction by springs 60 which maintain the extensions 54 against elements 48. The springs 60 are secured to and held in tension by a pin 59 secured to the extension 54 and a pin 61 secured to the plate 32. The flexible strips or bands 56 are secured to the flexible band 30 at different places along the slit opening 22.

When it is desirable to control the amount of light passing through the slit opening 22, the various controls 42 are used to actuate the cables 40. The cables 40 cause the elements 48 to move in one direction or the other against the extensions 54. When the pivot arms 50 are pivoted about pivot pins 52 in accordance with the movement of the extensions 64, the flexible strips 56 cause the areas of the flexible band 30 to move one way or another. In the example illustrated, if the band 30 is moved to the right, the area of the slit opening on the right side of the band as illustrated will become smaller. Consequently, less light will pass through the adjusted area of the slit opening 22. On the other hand, if the flexible band 30 is moved to the left by movement of the adjustment control means in the opposite directions, the band 30 will move to the left making the slit opening on the light transmitting side of the band larger thereby allowing more light to pass through the slit opening 22.

When the light transmitted through the slit opening 22 is different along different portions of the curved slit area, the light passing therethrough may be made relatively uniform by varying discrete areas of the band 30 along the length of the slit opening 22.

The center of the band 30 is maintained fixed by a fixed member 62 connected between the base plate 32 and the center of the band 30. This area of the band 30 is not adjustable. This arrangement provides a reference from which light adjustments at different other areas on the band 30 may be made.

Cable holder 64 is mounted to the plate 32 to support some of the relatively long cables 40 between the manual control knobs 42 and the various adjustment elements.

As an aid in the adjustments of the various mechanisms to control the open area of the slit opening 22, light intensity meters may be employed along different areas of the slit opening on the side of the opening on which the light is to be controlled. The controls 42 may then be manually adjusted until the light at all the areas involved are relatively uniform. The means employed for adjustment may be automatic. For example, light sensors may be disposed in the apparatus at different points to measure the amount of light passing through the slit opening 22. The light sensors may be employed to produce electrical signals to control the movements of the various elements used to discrete areas associated with the slit opening 22. Such automatic systems may employ servo loops and may, if desired, constantly monitor the intensities of the light passing through the slit opening 22 and correct automatically.

Control of the light transmitted through different areas of the slit opening makes it possible to provide relatively uniform illumination to a curved area on a mask which is to be imaged with optimum efficiency. The curved slit opening may be designed to fit into different optical systems where different shaped mirror and lens of various types are employed.

What is claimed is:

1. Means for controlling the transmission of light from a light source to a mask for reproducing an image comprising;
   a plate member having an elongated curved slit opening disposed between said light source and said element,
   a flexible band secured to said plate member and extending along said slit opening, said flexible band disposed perpendicular to said plate member to obstruct light from said light source from passing through said slit opening,
   a plurality of sets of adjustment elements connected between spaced areas on said flexible band and said plate member to permit independent flexure of said flexible band at selected points to vary the degree of the slit opening along its length,
   said plurality of sets of adjustment elements comprising a plurality of flexible strips secured between said flexible band and a plurality of brackets pivotally mounted to said plate member, a plurality of flexible cables connected to move said brackets and thereby said flexible band, and manual control elements for selectively adjusting said flexible cables thereby controlling the effective width of said slit opening along the length thereof.

2. Means for controlling as set forth in claim 1 wherein a plurality of springs are connected between said plurality of brackets and said plate member to normally bias said brackets in set positions.

3. Means for controlling as set forth in claim 2 further comprising fixed connection means connected from approximately the center of said flexible band to said plate member to provide a reference area from which adjustments may be made.

4. Means for controlling as set forth in claim 3 further including,
 a wafer to be exposed,
 a ring field projection system disposed between said mask and said wafer.

* * * * *